United States Patent
Apel

(10) Patent No.: US 6,681,631 B2
(45) Date of Patent: Jan. 27, 2004

(54) PIEZOELECTRIC SENSOR

(76) Inventor: Peter Apel, Grabenstrasse 81, 53855 Troisdorf (DE)

(*) Notice: Subject to any disclaimer, the term of this patent is extended or adjusted under 35 U.S.C. 154(b) by 0 days.

(21) Appl. No.: 10/312,974

(22) PCT Filed: Jun. 29, 2001

(86) PCT No.: PCT/DE01/02362
§ 371 (c)(1),
(2), (4) Date: Mar. 4, 2003

(87) PCT Pub. No.: WO02/03042
PCT Pub. Date: Jan. 10, 2002

(65) Prior Publication Data
US 2003/0164046 A1 Sep. 4, 2003

(30) Foreign Application Priority Data
Jul. 4, 2000 (DE) .......................................... 100 31 793

(51) Int. Cl.⁷ .......................... G01P 15/09; H01L 41/22
(52) U.S. Cl. .................... 73/514.34; 310/326; 310/366; 29/25.35
(58) Field of Search ...................... 73/514.34; 310/311, 310/326, 327, 340, 345, 364, 366; 29/25.35

(56) References Cited

U.S. PATENT DOCUMENTS

| | | | | |
|---|---|---|---|---|
| 4,194,194 A | * | 3/1980 | Redfern ...................... | 340/566 |
| 4,499,394 A | * | 2/1985 | Koal ........................... | 310/330 |
| 5,406,682 A | * | 4/1995 | Zimnicki et al. ........... | 29/25.35 |
| 5,687,462 A | * | 11/1997 | Lazarus et al. ............ | 29/25.35 |
| 6,263,734 B1 | * | 7/2001 | Fujii et al. ................. | 73/514.34 |
| 6,404,107 B1 | * | 6/2002 | Lazarus et al. ............. | 310/328 |

\* cited by examiner

*Primary Examiner*—Richard A. Moller
(74) *Attorney, Agent, or Firm*—Fulwider Patton Lee & Utecht, LLP

(57) ABSTRACT

A piezoelectric sensor includes a carrier, a piezoelectric measurement sensing element arranged on the carrier, a covering layer covering the measurement sensing element and an electronic evaluation unit. The measurement sensing element is formed by a piezoelectric layer. The carrier has a first contact layer electrically connected to the piezoelectric layer and the covering layer has a second contact layer electrically connected to the piezoelectric layer. The electronic evaluation unit is able to determine a mechanical loading of the piezoelectric layer by evaluating the difference of electrical potential between the first contact layer and the second contact layer.

20 Claims, 1 Drawing Sheet

PIEZOELECTRIC SENSOR

RELATED APPLICATIONS

This application claims the benefit of PCT International Application Serial No. PCT/DE01/02362, filed Jun. 29, 2001 which claims the benefits of German Utility Model Application Serial No. 100 31 793.6, filed Jul. 4, 2000.

BACKGROUND OF THE INVENTION

1. Field of the Invention

The invention relates to piezoelectric sensors.

2. Description of the Related Art

A piezoelectric sensor is known from German Patent 28 431 938. In this sensor the charge transfer of a piezoelectric film, which is converted into the desired measurement signal via an external electronic evaluation unit, is used as the measurement value. These sensors have the disadvantage that the length of the paths to the electronic evaluation unit are limited and a further component must be arranged remotely with the electronic evaluation unit.

Sensors of the above-mentioned type are known in addition as impact sensors having a seismic mass, the seismic mass being pressed against the piezoelectric layer as a result of an impact and the acceleration caused thereby. This pressure on the piezoelectric layer causes, in turn, a charge transfer which can be picked up and evaluated by means of contacts on each side of the surface of the piezoelectric layer. A sensor of this type is described by Gevatter in "Handbuch der Mess- und Automatisierungstechnik", VDI Verlag 1998.

These sensors with a seismic mass have, in addition to the disadvantages of the above-mentioned film-type sensors, the disadvantage that the seismic mass must be excited. Furthermore, because of the movable guidance system of the seismic mass, a comparatively complex and costly mechanism must be provided which, because of the moving parts, leads to high production costs and, in addition, to a higher risk of failure. Finally, construction of very sensitive sensors is possible only at disproportionate cost, as measurement is only possible if the seismic mass is excited by the weak signal. For this reason a sensor of this kind can hardly be used, for example, as a vibration meter.

Hence, those skilled in the art have recognized a need for a sensor which can be manufactured at low cost, is easily installed and can measure economically and in a simple manner even weak signals, such as vibrations or material deformations, by utilizing the piezoelectric effect. The invention fulfills these needs and others.

SUMMARY OF THE INVENTION

Briefly, and in general terms, the invention is directed to a piezoelectric sensor including a carrier, a piezoelectric measurement sensing element arranged on the carrier, a covering layer covering the measurement sensing element and an electronic evaluation unit. The measurement sensing element is formed by a piezoelectric layer. The carrier has a first contact layer electrically connected to the piezoelectric layer, the covering layer has a second contact layer electrically connected to the piezoelectric layer and the electronic evaluation unit is able to determine a mechanical loading of the piezoelectric layer by evaluating the difference of electrical potential between the first contact layer and the second contact layer.

These and other aspects and advantages of the invention will become apparent from the following detailed description and the accompanying drawings which illustrate by way of example the features of the invention.

DETAILED DESCRIPTION OF THE PREFERRED EMBODIMENTS

Figure 1:
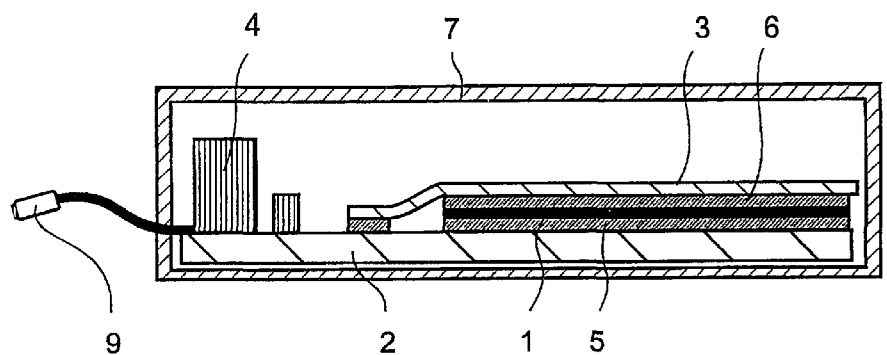
FIG. 1 is a side view of a sensor according to the invention.

Referring now to the drawings, wherein the reference numerals denote like or corresponding parts throughout the figures, and particularly to FIG. 1, there is shown a piezoelectric sensor formed by a carrier 2 and a film-like piezoelectric layer 1 arranged thereon. The piezoelectric layer 1 is covered by a covering layer 3, both the covering layer 3 and the carrier 2 are configured to be electrically conductive to the piezoelectric layer 1. For this purpose the carrier 2 is provided at least on its side facing towards the piezoelectric layer 1 with a first contact layer 5. The covering layer 3 is provided with a second contact layer 6. Both layers, the first contact layer 5 and the second contact layer 6, can be produced on the respective component by means of vacuum evaporation; alternatively thin metal or precious metal foils can be bonded thereto.

In the front area, the covering layer 3 is connected to the carrier 2, the conductive second contact layer 6 is connected to an internal electronic evaluation unit 4, also arranged on the carrier, by means of conductive tracks. The first contact layer 5 is connected to the electronic evaluation unit 4 likewise by means of conductive tracks. This electronic evaluation unit 4 can carry out the complete evaluation of the measurement signal or can take over only a part of the signal processing and can transmit an intermediate signal to an external signal processing unit 8 (not shown). For this purpose the connecting cable in the exemplary case illustrated is provided with a standardized interface 9 which makes possible simple connection of the sensor to a field bus system.

For reasons of clarity dimensions are not reproduced to scale in the figures. In practice the piezoelectric layer 1, like the first contact layer 5 and the second contact layer 6, will be significantly thinner. In the embodiment shown the sensor is surrounded by a housing 7, illustrated here as a hollow housing. However, the housing 7 is preferably injection molded around the functional components so that the latter are enclosed in an air-free manner. The housing 1 can also enclose the carrier 2 or can be closed laterally by the latter. In both cases the housing 7 must be so designed that twisting of the piezoelectric layer 1 analogously to the vibration or deformation of the component on which the sensor is arranged remains possible.

Figure 2:
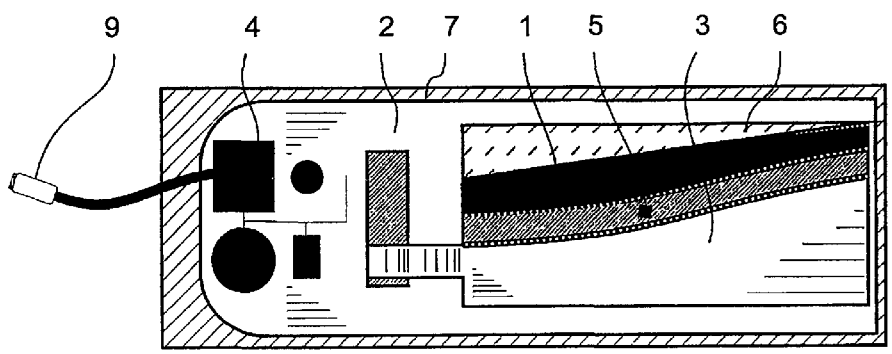
FIG. 2 is a top view of the sensor illustrated in FIG. 1.

FIG. 2 shows the sensor illustrated in FIG. 1 in a top view, partially in cross-section. In the right-hand area the piezoelectric layer 1 with the covering layer 3 is arranged in a sandwich structure on the carrier 2, the first contact layer 5 and the second contact layer 6 being interposed respectively between the above-mentioned elements. The internal electronic evaluation unit is represented schematically here and consists of a miniature integrated circuit having the usual electronic components for signal processing, which integrated circuit can be formed by the left-hand part of the carrier 2 or can be placed thereon. The covering layer 3, for example a thin silver foil, is connected in the area facing towards the electronic evaluation unit 4 to a contact element which in turn is connected to the electronic evaluation unit 4 via conventional conductive tracks. The bonding to the first contact layer 5 located below is effected in a similar manner.

In one embodiment of the invention the evaluation of the measurement signal is not carried out exclusively via the internal electronic evaluation unit 4. In this case the interface 9 is used for connection to an external electronic evaluation unit 8 which takes over further signal processing. By this means triggering and initializing of the sensor can be carried out. In particular in the case of very weak signals which can occur, for example, when the sensor is used as a vibration sensor for detecting disturbance signals, the cost required for miniaturization can be reduced by means of an external electronic evaluation unit 8.

Figure 3:
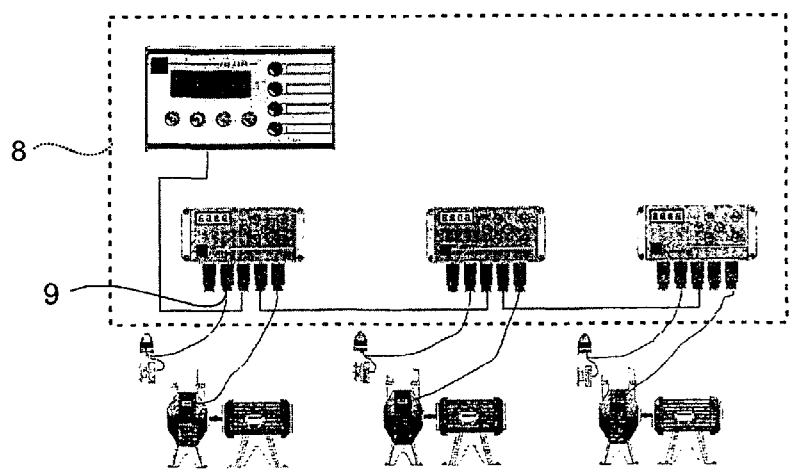
FIG. 3 shows a networking of a plurality of sensors for monitoring an industrial manufacturing process.

FIG. 3 shows an exemplary application of the invention in which defects and damage to pumps can be detected by monitoring the solid-borne sound in the pump housing. In this case normal vibrations are manifested by pump noises which, in case of damage, for example, damage to a pump wheel, are changed in frequency or amplitude. For this purpose the sensor according to the invention first measures the "normal" pump noise and records it as operating noise. In case of changes to this noise the change can be filtered out by frequency analysis and interpreted as a defect or as a normal change caused by operating conditions.

In the application illustrated in FIG. 3 the individual sensors are interconnected via a field bus which makes possible connection of the interfaces 9 to the external electronic evaluation unit 8. For this purpose a common evaluation and control unit is connected to the sensors, a display and operating element being interposed. If defects are detected the required measures can be taken by means of conventional control systems.

The sensor together with the evaluation electronics is configured to have the thickness of a film, the piezoelectric layer having a thickness of less than 1 mm and the evaluation electronics together with the measurement sensing element being arranged on the film-like carrier which is manufactured from an elastic material which damps vibrations to only a slight degree.

Through the configuration of the sensor according to the invention the seismic mass is dispensed with and a thin, piezoelectric layer arranged on the elastically deformable carrier is used as the measurement sensing element, the deformations of which carrier it converts into a measurement signal. The evaluation electronics are arranged on the carrier so that transmission of the weak piezoelectric measurement signal from the film to the evaluation electronic unit over a relatively long distance is unnecessary. In this way the cost of manufacturing and installing the sensor can be considerably reduced and the sensor can be provided for the first time as a piezoelectric sensor for entirely new applications.

The assemblies of the new type of sensor are the flexible carrier and the covering layer, together with the piezoelectric layer arranged therebetween. The covering layer and the carrier are so configured that the charge transfer within the piezoelectric layer as a result of a deformation can be picked up by the carrier and covering layer. The deformation of the piezoelectric layer can be both a twisting about any axis and a pressure acting in a vertical direction on the layer itself.

All the components of the sensor are sufficiently flexible for the sensor, which can be bonded to a surface, to be able to convert vibrations present in the component carrying the sensor as a result of solid-borne sound, into vibrations of the piezoelectric layer. This in turn produces a charge layer which changes over time as a function of the amplitude and duration of the vibration, which charge layer can be picked up via the carrier and the covering layer and converted into the desired signal by the evaluation electronics.

A sensor constructed in this manner can be used in a multiplicity of applications and, because it can be manufactured at especially low cost, can often be integrated as an additional link in a control chain. For example, in a preferred embodiment of the sensor, the sensor can be used in the context of triggering an airbag of a motor vehicle, which airbags are at present triggered almost exclusively by impact sensors. In particular, in accidents in which the vehicle is first subjected to an impact but has not yet suffered the accident, for example when colliding with a safety barrier and subsequently skidding, the airbag is frequently triggered by the first impact and, because it collapses again after a few fractions of a second, is no longer available during the actual crash of the vehicle. In this situation the sensor according to the invention can be used in addition to the electronic system and, for example, can be bonded to the inside of a body panel of the vehicle. The sensitivity of the sensor can be so adjusted via the evaluation electronics that a relatively large deformation, in addition to the impact, must be necessary to trigger the airbag.

The piezoelectric layer of the sensor is only a few $\mu$m thick and is preferably manufactured from a film. Piezoelectric film of this kind is obtainable by the meter, the price for 1 $m^2$ of film being approximately the same as the price of the piezoelectric sensors with seismic mass used hitherto. A large number of sensors can be manufactured from 1 $m^2$ of film, so that, bearing in mind the fact that the remaining components of the sensor involve no significant costs, the sensor according to the invention can be manufactured approximately 10 to 50 time more cheaply than the sensors known and used hitherto. This makes its use in many applications economic for the first time. Multiple monitoring by the use of a plurality of sensors also now becomes possible and economic.

Through the use of the piezoelectric film in almost any desired shape an impact sensor can be constructed, for example, as protection against pinching. For example, in the case of a roll-up door, a lower rubber lip can be provided with the measurement sensing element, the carrier being formed by an outer rubber layer and the covering layer by an inner rubber layer. When the rubber lip makes contact at any point the sensor will emit a signal which can be used to switch off the door mechanism permanently or temporarily in case of jamming. This can also be used for doors of a public transport vehicle or for electrically-actuated windows.

Further exemplary applications of the sensor according to the invention are the detection of vibrations as a result of machine damage, such as can occur in pump housings, in shaft bearings or in rail vehicles. For example, the fracture of a wheel rim which would endanger train operation can be detected by the additional vibrations occurring as a result of the fracture and a signal can be emitted, or a control intervention made, in good time before derailment of the train. In the case of a pump housing, which must normally tolerate a uniform vibration as a result of splashing of the liquid to be pumped or as a result of bearing noise, the deviation from the normal frequencies or amplitudes in case of bearing damage can be detected and action can be taken before more serious damage occurs. Finally, the sensor can also be used for the construction of alarm systems or movement detectors, for example when display windows or motor vehicles are to be protected from malicious damage by scratching.

The carrier is preferably manufactured from a flexible material, for example a flexible plastics material. The first contact layer, which can be formed, for example, by a vacuum-evaporated coating of silver, can then be applied to this material. Bonding on of a metal foil or a foil made of another conductive material is also possible.

In a preferred embodiment of the invention the carrier is divided into two areas, the actual sensor being arranged in a sensor area while at least a part of the evaluation electronics is arranged in an adjacent area. In the sensor area the first contact layer is applied, while leaving free an edge portion, to which contact layer the thin piezoelectric film of the same size can then be bonded. The covering layer, which carries the second contact layer in the area of the piezoelectric film, is applied in turn to this piezoelectric film. This second contact layer can also be applied to the covering layer by vacuum evaporation or can be bonded on as a foil. The first contact layer and the second contact layer are then connected to the evaluation electronics, and have in particular a cable connection to corresponding contacts or are so configured that they have prolongations extending in the manner of conductive tracks in the direction of the evaluation electronics and connected to the corresponding contacts.

In an alternative embodiment of the invention the contact layer can also be arranged inside or below the carrier or the covering layer, in which case the electrical contact to the piezoelectric layer is made via through-connections.

Preferred thicknesses of the piezoelectric layer are less than 1 mm, in particular a few $\mu$m, in particular less than 20 $\mu$m, thicknesses even below 10 $\mu$m being possible. In a concrete embodiment of the sensor as a vibration meter a thickness of the piezoelectric layer of, for example, 6 $\mu$m is used. This piezoelectric film is joined to the carrier and the covering layer with inclusion of the first contact layer and the second contact layer, the connection being effected in particular by bonding during the manufacturing process.

The carrier can be manufactured from an electrically non-conductive material, although it is also possible for the carrier itself to be conductive. In this case it is no longer necessary to apply a separate first contact layer and it is sufficient if the carrier itself forms the first contact layer. The same applies in an analogous manner to the covering layer which, of course, can also be electrically conductive. The carrier and the covering layer can have a thickness of less than 1 mm, a material thickness between 120 $\mu$m and 160 $\mu$m being especially preferred. In the case of a concrete embodiment the first contact layer and the second contact layer have a thickness of 5 to 50 $\mu$m, so that a total thickness of the sensor in the area of the measurement sensing element of less than 300 $\mu$m (without housing) results.

By dispensing with the seismic mass the sensor can therefore be kept very thin, enabling it to be used where it has not hitherto been possible to use piezoelectric sensors or sensors of any kind. At the same time the sensor has good resistance to pressure. For this reason it can be used as a washer in a screw connection, the pressure sensing element being clamped by the screw insertion force and the evaluation electronics being arranged beside the sensor. By means of this sensor the screw insertion force and an impact load on the screw can be monitored and, for example, slackening of the screw or inadmissible tightening can be detected at an early stage.

The possibility of using the sensor as a pressure-loaded impact sensor in a screw connection makes it possible to measure and control the sealing force of a packaging machine, in which the two halves of the tool are pressed against one another in the context of vacuum packaging. In this case the sealing force can be measured via measurement of the retention force of the clamping screws and regulated if necessary. Finally, an internal pressure in a chamber, for example, can also be measured by means of a sensor of this kind.

In the case of an extruder, for example, the internal pressure in the front area of the extruder can be measured by means of the above-mentioned principle via the retention force of the screws by which the orifice cap is fixed to the extruder housing, without the need to introduce a pressure measuring device into the chamber by means of complex and expensive constructional measures. In the case of an internal combustion engine a sensor could be arranged in the area of the valve-actuating cam, which sensor measures the closing pressure of the valve and therefore the pressure in the combustion chamber. By comparing the internal pressures in the cylinders a defect can thereby be quickly and reliably detected without major complexity or cost.

Through the omission of the seismic mass a very sensitive sensor is produced at low manufacturing cost. A sensor manufactured according to the above-mentioned principle can, for example, if bonded to a table-top, detect whether or not speaking is taking place in a room. It is therefore so sensitive that it can convert the sound waves transmitted to the table-top and further transmitted therein as solid-borne sound, into a measurement signal. A conventional piezoelectric sensor with seismic mass would require a very costly method of mounting this mass.

The first and second contact layers can also be subdivided into segments to construct a still more sensitive sensor, in which case the evaluation electronics should pick up the potential difference between each two opposed segments of the first and second contact layers. In this way, not only can spatial information on the charge transfer within the piezoelectric layer be obtained but the risk of failure of the sensor can be reduced, since a plurality of contacts are present and the failure of one pair of segments will not cause the failure of the sensor. In particular in the case of self-calibration of the sensor, the sensor is so adjusted by the subsequent calibration process in case of failure of one pair of sensors, for example as a result of a broken cable, that adjacent segments can take over the function of the failed part.

The sensor is preferably integrated together with the evaluation electronics in a housing, which housing can be produced especially easily by molding the functional components into a plastics block. The carrier can be installed on a further carrier plate which can be mounted at the actual point of application, for example a vehicle body panel or a pump housing. To transmit the vibrations of the housing, which, it in the case of a vibration meter, are to be measured, either the carrier or the additional interposed carrier element can be bonded to the housing to be monitored.

Instead of a rigid housing the housing can also be formed by a film which encloses the remaining functional parts of the sensor itself. For this purpose, in a manner similar to the technique known from vacuum packaging, a lower and an upper film can, for example, be provided, the sensor being arranged either completely or partially between these films. After evacuation of the cavity these films are either joined by means of a continuous peripheral seam, for example by welding or by means of a bonded seam. The sensor manufactured in this way can, for example, then be bonded to the component to be monitored.

The evaluation electronics preferably include a programmable amplifier which makes it possible to tune the evaluation electronics to the vibration to be measured in relation to the background signal. The evaluation electronics can be completely arranged on the carrier, although it is also possible for the evaluation electronics to be arranged only partially on the carrier and for an external part of the evaluation electronics to be housed in a separate housing. The latter is then connected to the sensor itself via a digital cable or another cable meeting a conventional bus standard. Both the evaluation electronics on the carrier and external evaluation electronics preferably have an interface for a standard bus system. In this way the sensor according to the invention can be easily and simply integrated into a control system, or example in the context of a monitored manufacturing process.

The evaluation electronics preferably include a signal processor and a program memory in which is stored software which controls the sensor and evaluates the measurement or the measured value. By means of frequency analysis of the time behavior of the measured potential difference the software detects an unusual frequency change and in this case emits a signal. In this way the regular pump noise caused by splashing and bearing noise in the case of pump monitoring cannot trigger a signal, whereas damage to a bearing shell and an unusual frequency of the solid-borne sound caused thereby triggers a control signal or even a speed reduction or unloading of the pump.

To be able to perform this function the software must be able to distinguish the usual operating noise from unusual noises. For this purpose a self-calibrating routine is preferably provided which is run from time to time and at the start of operation. For this purpose the software records the change over time of the solid-borne sound during a preset period, this period being initially interpreted as the normal case. During subsequent measurements the measurement signal is then in each case compared to the signal measured in the reference period and an unusual deviation is interpreted as a defect or damage. In this case an alarm signal can be emitted or an automatic intervention can be made in the control system of the device monitored. To avoid false alarms or other malfunctions a tolerance limit can be preset which must be exceeded for the fault signal to be emitted. This tolerance limit can likewise be adjustable.

By a particular configuration of the evaluation electronics the sensor, which operates in principle as a dynamic sensor, can also be used as a static sensor at least for a certain time period. For this purpose the electronics include an integrator which integrates the measured signal and thereby determines the actual state even without a change over time of the signal. By the use of digital evaluation electronics the value of the magnitude measured can also be permanently determined.

By means of an additional pressure mass the sensor according to the invention can also be used as a pressure sensor or an accelerometer. This pressure mass can be formed, for example, by a flat pressure plate which is mounted in a perpendicularly displaceable manner with respect to the sensor. The sensor can be arranged between a surface of a component to be monitored and the pressure plate, whereby an acceleration in both directions can be measured by means of an additional spring force acting between the pressure plate and the sensor. This additional compressive force can be formed by one or more springs or by a resilient intermediate layer which is arranged, for example, between the sensor and the pressure plate and causes a continuous loading of the sensor.

When the pressure plate is accelerated either a force in the direction of the measurement sensing element or an unloading of the measurement sensing element is obtained, causing a charge transfer within the piezoelectric layer. The pressure plate can cover the entire sensor or can act only on a partial area thereof. In the case of a possible embodiment of the sensor configured as an accelerometer the housing can be screwed to a component to be monitored and the pressure plate can have sufficiently large through-holes for it to be fixable to the sensor by means of the screws used. In this case, of course, the housing must be so configured that transfer of the compressive forces from the pressure plate to the piezoelectric measurement sensing element is possible.

Although, with this extension of the measurement sensing element, a seismic mass is again incorporated the advantageous properties of the sensor according to the invention can nevertheless now be combined with the additional performance feature of acceleration measurement. For example, a very sensitive, low-cost sensor can be constructed according to the inventive principle which can also detect an acceleration without twisting or other deformation of a component. By contrast, although a conventional sensor with seismic mass could measure acceleration, to achieve the same sensitivity in measuring solid-borne sound it would need to be constructed in a very much more complex and expensive manner, since vibrations can only be measured if the seismic mass is excited. By means of the invention this detour via the utilization of mass excitation can be dispensed with.

It will be apparent from the foregoing that while particular forms of the invention have been illustrated and described, various modifications can be made without departing from the spirit and scope of the invention. Accordingly, it is not intended that the invention be limited, except as by the appended claims.

What is claimed is:

1. A piezoelectric sensor comprising a carrier, a piezoelectric measurement sensing element arranged on the carrier, a covering layer covering the measurement sensing element and an electronic evaluation unit, the measurement sensing element being formed by a piezoelectric layer, the carrier having a first contact layer electrically connected to the piezoelectric layer, the covering layer having a second contact layer electrically connected to the piezoelectric layer and the electronic evaluation unit being able to determine a mechanical loading of the piezoelectric layer by evaluating the difference of electric potential between the first contact layer and the second contact layer, wherein the sensor together with the electronic evaluation unit is configured to have the thickness of a film, the piezoelectric layer having a thickness of less than 1 mm and the electronic evaluation unit being arranged beside the measurement sensing element on the film-like carrier which is manufactured from an elastic material which damps vibrations to only a slight degree.

2. The piezoelectric sensor of claim 1 wherein the carrier and the piezoelectric layer are joined together in a planarly adhering manner.

3. The piezoelectric sensor of claim 2 wherein the thickness of the piezoelectric layer is less than 10 $\mu$m.

4. The piezoelectric sensor of claim 1 wherein the carrier has a carrier layer made of an electrically non-conductive material which is provided with the first contact layer and on which, beside the piezoelectric layer, the electronic evaluation unit is arranged.

5. The piezoelectric sensor of claim 1 wherein next to the electronic evaluation unit a planar sensor area is built up in a sandwich structure, the carrier being provided in the sensor area with a first contact layer, the piezoelectric layer being arranged on the first contact layer and electrically connected thereto and the covering layer having the conductive second contact layer which faces towards the piezoelectric layer being arranged on the latter.

6. The piezoelectric sensor of claim 1 wherein the carrier and/or the covering layer is/are formed by a flexible film the thickness of which is less than 200 µm.

7. The piezoelectric sensor of claim 1 wherein the thickness of the first contact layer and the thickness of the second contact layer are in each case less than 70 µm.

8. The piezoelectric sensor of claim 1 wherein it has a housing containing the other components.

9. The piezoelectric sensor of claim 1 wherein the housing is manufactured by molding of plastics material around the sensor.

10. The piezoelectric sensor of claim 1 wherein the housing is formed by an upper and a lower film which are joined together by a connecting seam surrounding the remaining components of the sensor.

11. The piezoelectric sensor of claim 1 wherein the first contact layer and the second contact layer are formed by thin foils of a metallic material.

12. The piezoelectric sensor of claim 11 wherein the foils of the first contact layer and the second contact layer have in each case at least one cable-like prolongation which is connected to the electronic evaluation unit for bonding.

13. The piezoelectric sensor of claim 1 wherein the first contact layer and the second contact layer are subdivided into segments by means of electrically insulating gaps and the electronic evaluation unit is connected to each of the segments in such a way that it can determine the potential difference between a pair of segments of the first contact layer and of the second contact layer.

14. The piezoelectric sensor of claim 1 wherein the electronic evaluation unit includes a programmable amplifier.

15. The piezoelectric sensor of claim 1 wherein the electronic evaluation unit has an interface for connection to a field bus, in particular a CAN bus.

16. The piezoelectric sensor of claim 1 wherein the electronic evaluation unit includes a signal processor and a program memory with software stored therein, the software being able to detect an unusual frequency change by means of frequency analysis of the measured potential difference for measurement of solid-borne sound.

17. The piezoelectric sensor of claim 16 wherein the software includes a calibrating routine which after a preset period identifies the change over time of the solid-borne sound as the normal case and uses the latter as the basis for subsequent control measurements, the measured signal being compared to that of the normal case and the software being able to emit a signal in case of deviations above a preset tolerance limit.

18. The piezoelectric sensor of claim 1 wherein it has a second external electronic evaluation unit which is connected to the electronic evaluation unit via a digital connection and has an interface for connection to a field bus system.

19. The piezoelectric sensor of claim 1 wherein it has a pressure plate arranged parallel to the piezoelectric layer, which pressure plate is guided movably in a direction perpendicular to the piezoelectric layer.

20. The piezoelectric sensor of claim 19 wherein a preloaded resilient element is arranged between the piezoelectric layer and the pressure plate.

* * * * *